(12) United States Patent
Chambion (10) Patent No.: US 11,289,359 B2
(45) Date of Patent: Mar. 29, 2022

(54) METHOD FOR MANUFACTURING AN ELECTROLUMINESCENT DEVICE

(71) Applicant: COMMISSARIAT A L'ENERGIE ATOMIQUE ET AUX ENERGIES ALTERNATIVES, Paris (FR)

(72) Inventor: Bertrand Chambion, Pontcharra (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/956,377

(22) PCT Filed: Dec. 20, 2018

(86) PCT No.: PCT/FR2018/053437
§ 371 (c)(1),
(2) Date: Jun. 19, 2020

(87) PCT Pub. No.: WO2019/122735
PCT Pub. Date: Jun. 27, 2019

(65) Prior Publication Data
US 2021/0090933 A1 Mar. 25, 2021

(30) Foreign Application Priority Data
Dec. 22, 2017 (FR) ..................... 17 63167

(51) Int. Cl.
*H01L 21/683* (2006.01)
*H01L 33/00* (2010.01)
(Continued)

(52) U.S. Cl.
CPC ...... *H01L 21/6835* (2013.01); *H01L 25/0753* (2013.01); *H01L 33/0093* (2020.05);
(Continued)

(58) Field of Classification Search
CPC ............ H01L 21/6835; H01L 33/0093; H01L 25/0753; H01L 33/08; H01L 33/24;
(Continued)

(56) References Cited

U.S. PATENT DOCUMENTS

| 8,368,735 B2 * | 2/2013 | Soulliaert | ............ G03G 15/326 |
| | | | 347/238 |
| 8,809,086 B2 * | 8/2014 | Bader | ................... H01L 33/405 |
| | | | 438/29 |

(Continued)

FOREIGN PATENT DOCUMENTS

| FR | 3 012 676 A1 | 5/2015 |
| WO | WO 2016/060676 A1 | 4/2016 |

OTHER PUBLICATIONS

U.S. Appl. No. 16/179,355, filed Nov. 2, 2018, US 2019/0140008 A1, Bertrand Chambion et al.
(Continued)

*Primary Examiner* — Vu A Vu
(74) *Attorney, Agent, or Firm* — Oblon, McClelland, Maier & Neustadt, L.L.P.

(57) ABSTRACT

A method of manufacturing a device includes: —a) a first step for the formation of a temporary structure that comprises electroluminescent structures separated by trenches and comprising an electroluminescent face, the electroluminescent structures being bonded by means of a bond layer on a temporary substrate; b) an assembly step bringing the electroluminescent structures into contact with a host face of a host substrate; and c) a step for removal of the temporary substrate; wherein the bond layer, that comprises an electrically conducting organic polymer material at least partially transparent to light radiation, is at least partly kept after step c) and forms an electrode common to the light emitting faces, with a thickness of more than 20 nm.

18 Claims, 5 Drawing Sheets

(51) Int. Cl.
*H01L 25/075* (2006.01)
*H01L 33/08* (2010.01)
*H01L 33/24* (2010.01)
*H01L 33/62* (2010.01)

(52) U.S. Cl.
CPC .............. *H01L 33/08* (2013.01); *H01L 33/24* (2013.01); *H01L 33/62* (2013.01); *H01L 2221/68354* (2013.01); *H01L 2221/68368* (2013.01); *H01L 2933/0066* (2013.01)

(58) Field of Classification Search
CPC ........... H01L 33/62; H01L 2221/68354; H01L 2221/68368; H01L 2933/0066; H01L 27/156; H01L 51/003; H01L 33/005
USPC .......................................................... 438/28
See application file for complete search history.

(56) References Cited

U.S. PATENT DOCUMENTS

2012/0161183 A1 6/2012 Ubahara et al.
2016/0270176 A1 9/2016 Robin et al.
2017/0358562 A1* 12/2017 Banna ................. H01L 25/0753
2018/0233536 A1 8/2018 Chang

OTHER PUBLICATIONS

U.S. Appl. No. 16/472,037, filed Jun. 20, 2019, US 2020/0035864 A1, Bertrand Chambion et al.
International Search Report dated Apr. 25, 2019 in PCT/FR2018/053437 filed on Dec. 20, 2018, 2 pages.
Preliminary French Search Report dated Sep. 13, 2018 in French Application No. 1763167 filed on Dec. 22, 2017, 1 page.
Lu et al., "Development of Novel Silver Nanoparticles/Polymer Composites as High K Polymer Matrix by in-situ Photochemical Method", Electronic Components and Technology Conference, 2006, Proceedings. 56$^{th}$, 7 total pages.
Worfolk et al., "Ultrahigh electrical conductivity in solution-sheared polymeric transparent films", PNAS, 2015, vol. 112, No. 46, pp. 14138-14143.
Hong et al., "Transparent graphene/PEDOT-PSS coposite films as counter electrodes of dye-sensitized solar cells", Electrochemistry Communications, ELSEVIER, 2008, vol. 10, pp. 1555-1558.

* cited by examiner

METHOD FOR MANUFACTURING AN ELECTROLUMINESCENT DEVICE

TECHNICAL FIELD

This invention relates to a method of manufacturing an electroluminescent device. In particular, this invention relates to a method of manufacturing an electroluminescent device making use of a transfer of electroluminescent structures through a temporary substrate.

In this respect, the assembly method using the temporary substrate is done using an adhesion layer adapted to form a common electrode for the electroluminescent structures and to absorb mechanical stresses that could occur during the manufacturing process.

PRIOR ART

Figure 1A:
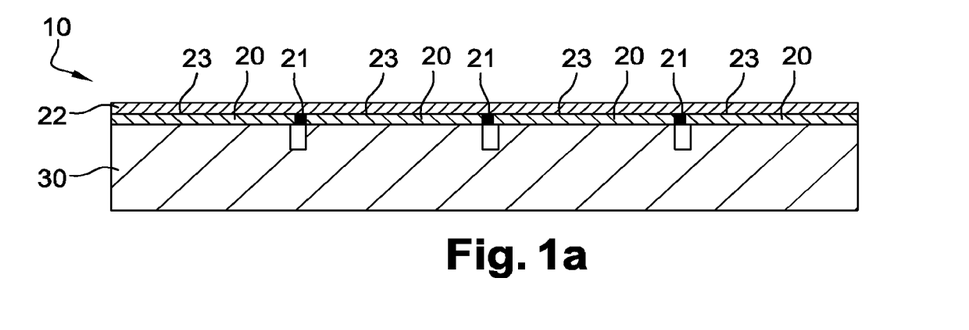
FIGS. 1a to 1e are diagrammatic representations of steps a) to e) in a method of manufacturing an electroluminescent device known in prior art.
Figure 1B:
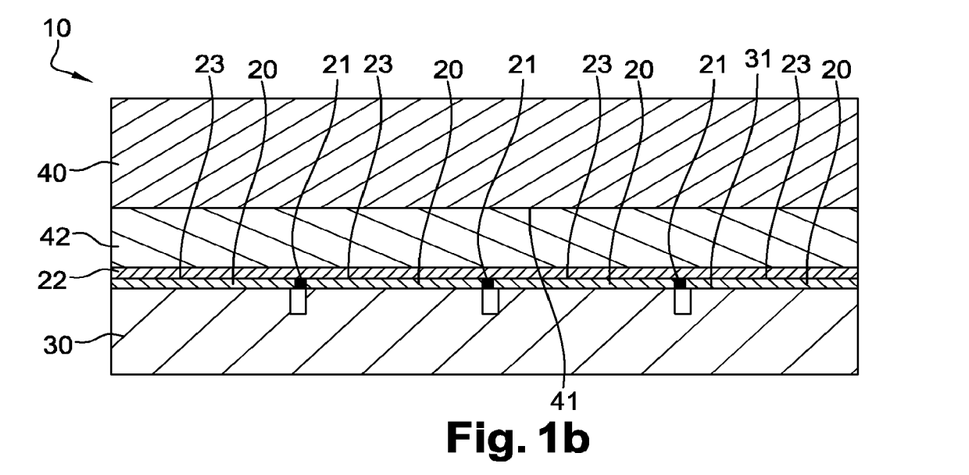
Figure 1C:
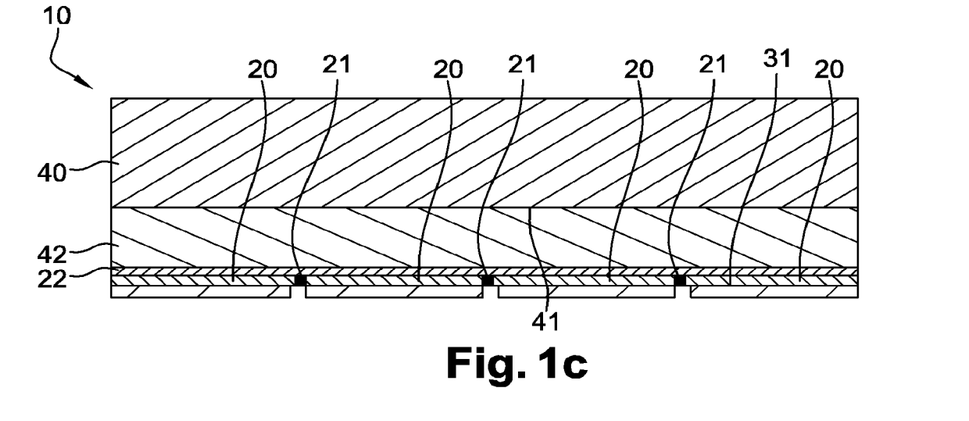
Figure 1D:
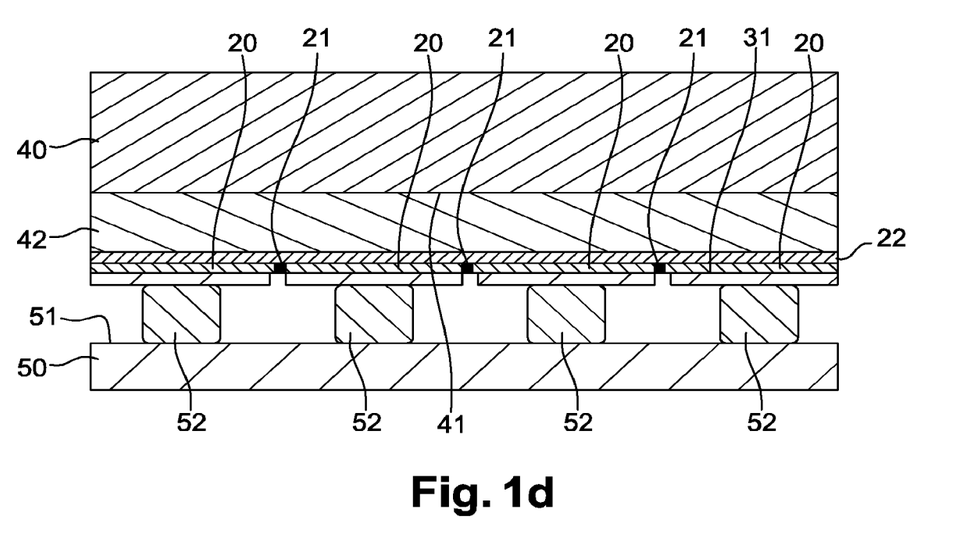
Figure 1E:
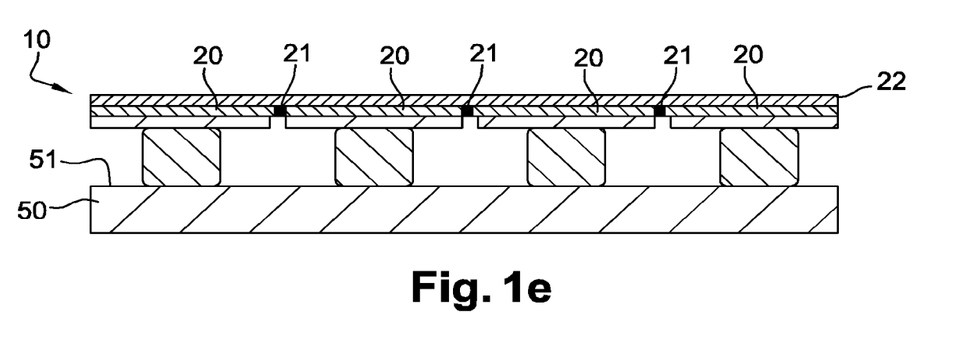

A method of manufacturing an electroluminescent device 10 known in prior art is represented on FIGS. 1a to 1e. It comprises the following steps:

a) the formation of electroluminescent structures 20 on one face called the front face 31 of a first substrate 30, said electroluminescent structures 20 are separated from each other by the trenches 21, and comprise a common electrode 22 electrically connecting them on their free face 23 (FIG. 1a);

b) a first assembly of electroluminescent structures 20 with one face called the temporary face 41 of a temporary substrate 40 using a bond layer (FIG. 1b);

c) an at least partial thinning of the first substrate 30 intended to expose the trenches 21 (FIG. 1c);

d) a second assembly of electroluminescent structures 20 with one face called the host face 51 of a host substrate 50, the host substrate 50 comprising interconnection means 52, that in combination with the common electrode 22 are arranged to individually address each of the electroluminescent structures 20 (FIG. 1d);

e) total removal of the temporary substrate 40 and the bond layer 42 (FIG. 1e).

After completion of step e), the electroluminescent structures 20 are in contact with the interconnection means 52 through their face opposite the free face 23, called the contact face.

The electroluminescent structures 20 may comprise light emitting diodes that can emit light radiation through their free face.

The light emitting diodes can be 2D light emitting diodes, in other words they may be plane and thus comprise a stack of semiconducting films.

Alternatively, the light emitting diodes can be 3D light emitting diodes, each comprising a plurality of light emitting nanowires perpendicular to the free face 23.

However, this manufacturing method known in prior art is not satisfactory.

Firstly, the common electrode is generally a layer of metal or doped semiconductor, that covers the trenches 21 so as to maintain continuity of the electrical connection between the free faces 23 of the electroluminescent structures 20.

However, the common electrode 22 comprises a zone of mechanical weakness at the location at which the trenches 21 are covered, that concentrates all stresses that can occur during the different steps in the method of manufacturing the electroluminescent device 10.

Such stresses are observed particularly after completion of the second assembly, and their origin is the lack of flatness of faces brought into contact, this lack of flatness being induced particularly by the interconnection means 52 located on the host face.

An excessive concentration of said stresses can lead to rupture of the common electrode 22 (in other words to an electrical discontinuity), and consequently making it impossible to address the electroluminescent structures 20 individually.

Furthermore, step e) to remove the temporary substrate 40 is also accompanied by removal of the bond layer 42 that can be long and expensive to implement.

One purpose of this invention is then to disclose a method for manufacturing that is easier to implement than the manufacturing method known in prior art.

Another purpose of this invention is to disclose a method conferring better mechanical strength on the electroluminescent structure.

Another purpose of this invention is to disclose a manufacturing method more tolerant to out-of-flatness of the faces brought into contact during the second assembly.

PRESENTATION OF THE INVENTION

The purposes of this invention are at least partly achieved by a method of manufacturing an electroluminescent device, the method comprising:

a) a first step for the formation of a temporary structure that comprises a plurality of individual electroluminescent structures separated from each other by trenches and each comprising a face, called the light emitting face, through which said structures can emit light radiation, the electroluminescent structures being bonded on their light emitting face by means of a bond layer on one face, called the temporary face, of a temporary substrate;

b) an assembly step that includes bringing the electroluminescent structures into contact on a face called the back face opposite the light emitting face, with a face called the host face of a host substrate;

c) a step for at least partial removal of the temporary substrate;

the method being characterised in that the bond layer, that comprises an electrically conducting organic polymer material at least partially transparent to light radiation, is at least partly kept after step c) and forms an electrode common to the light emitting faces, with a thickness of more than 20 nm, advantageously more than 500 nm, and even more advantageously more than 1 μm.

According to one embodiment, step a) includes the formation of the bond layer on either the temporary substrate or a first substrate, the first substrate comprising the plurality of electroluminescent structures on one of its faces called the first face.

According to one embodiment, step a) also includes an assembly step called the temporary assembly step, to assemble the temporary substrate and the first substrate.

According to one embodiment, step a) also includes at least partial removal of the first substrate.

According to one embodiment, an intermediate layer comprising a transparent conducting oxide is formed in direct contact with the light emitting faces of each of the electroluminescent structures.

According to one embodiment, the manufacturing method also includes the formation of through openings in the bond layer, partially exposing the light emitting faces, the through openings advantageously being formed during a dry or wet etching step.

According to one embodiment, the formation of the through openings is adapted to keep a section of the bond layer covering the trenches and a contour with a predetermined width of the light emitting faces.

According to one embodiment, the formation of through openings takes place either during step a) or after completion of step c).

According to one embodiment, the bond layer comprises second trenches formed to be conforming with the trenches, and filled in with a conducting material, advantageously the conducting material includes a transparent conducting oxide.

According to one embodiment, the organic polymer material includes at least one material chosen from among: Pedot PSS, poly(3,4-ethylenedioxythiophene): poly(styrene-sulfonate) (Pedot: PSS), Poly(fluorene)s, polyphenylenes, polypyrenes, Polyazulenes, polynaphthalenes, poly(pyrrole)s (PPY), polycarbazoles, polyindoles, polyazepines, polyanilines (PANI), poly(thiophene)s (PT), poly(p-phenylene sulfide) (PPS), Poly(acetylene)s (PAC), Poly(p-phenylene vinylene) (PPV).

According to one embodiment, the electroluminescent structures comprise a light emitting layer resting on a support substrate with a thickness of less than 10 μm, and advantageously less than 5 μm, from their light emitting face towards their back face.

According to one embodiment, each of the electroluminescent structures comprises an active layer intercalated between a first semiconducting layer and a second semiconducting layer.

According to one embodiment, the light emitting layer comprises a plurality of nanowires perpendicular to the light emitting face.

According to one embodiment, the electroluminescent structures are arranged in matrix formation.

According to one embodiment, the temporary substrate is only partially removed in step c), and comprises a material for which the optical transmission in the wavelength range covered by the light radiation is more than 1%, advantageously more than 50%, and even more advantageously more than 90%.

According to one embodiment, the host substrate comprises interconnection means on its host face that, in combination with the common electrode, are arranged to individually address each of the electroluminescent structures.

BRIEF DESCRIPTION OF THE DRAWINGS

Other characteristics and advantages will become clear in the following description of the method of manufacturing an electroluminescent device according to the invention, given as non-limitative examples, with reference to the appended drawings wherein.

DETAILED PRESENTATION OF PARTICULAR EMBODIMENTS

The invention described in detail below makes use of a method of manufacturing an electroluminescent device. In this respect, this invention discloses a method of transferring electroluminescent structures formed on a first substrate, to a host substrate. In particular, the transfer according to this invention implies an intermediate transfer of electroluminescent structures by the assembly of the first substrate and a temporary substrate by means of a bond layer.

According to this invention, the bond layer kept after completion of the manufacturing method, forms an electrode common to the light emitting faces and is made of a transparent and electrically conducting polymer material adapted to improve the mechanical strength of the electroluminescent device to be better than devices known in prior art.

FIGS. 2a to 4 show examples of the use of the method of manufacturing an electroluminescent device 100 according to this invention.

Figure 2A:
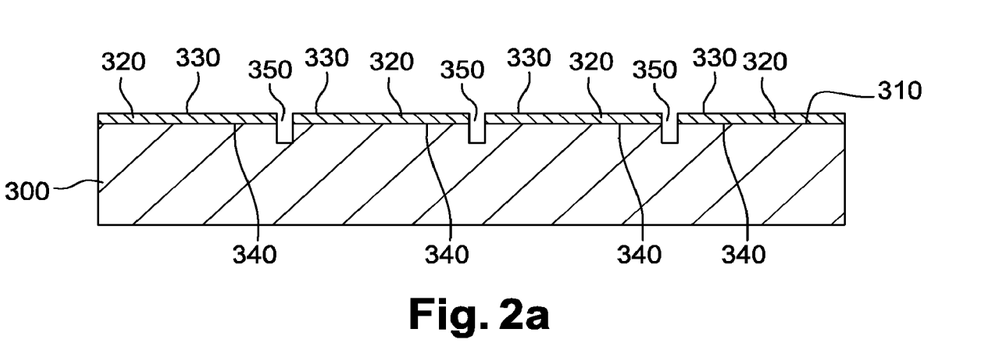
FIGS. 2a to 2e are diagrammatic representations of steps a) to c) in a method of manufacturing an electroluminescent device according to a first embodiment of this invention.
Figure 2B:
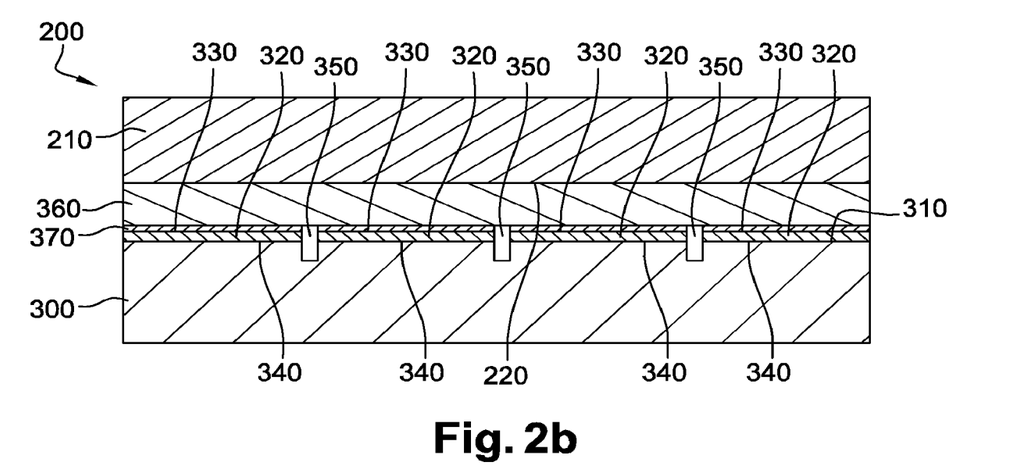

The method includes a step a) for formation of temporary structure 200 (FIG. 2b).

The temporary structure 200 then comprises a plurality of electroluminescent structures 320, separated by trenches 350, and each bonded on one face called the light emitting face 330, to a face called the temporary face 220 of a temporary substrate 210 by means of bond layer 360.

The temporary substrate 210 may comprise any type of material, and particularly silicon, silica (glass) or a metal.

"Electroluminescent structure" generally refers to a structure that emits light radiation when a current passes through it.

In this regard, the electroluminescent structures 320 can emit light radiation through their light emitting face 330.

"Light radiation" means for example radiation in the visible range of wavelengths, for example in a range of wavelengths between 400 nm et 800 nm.

Figure 2C:
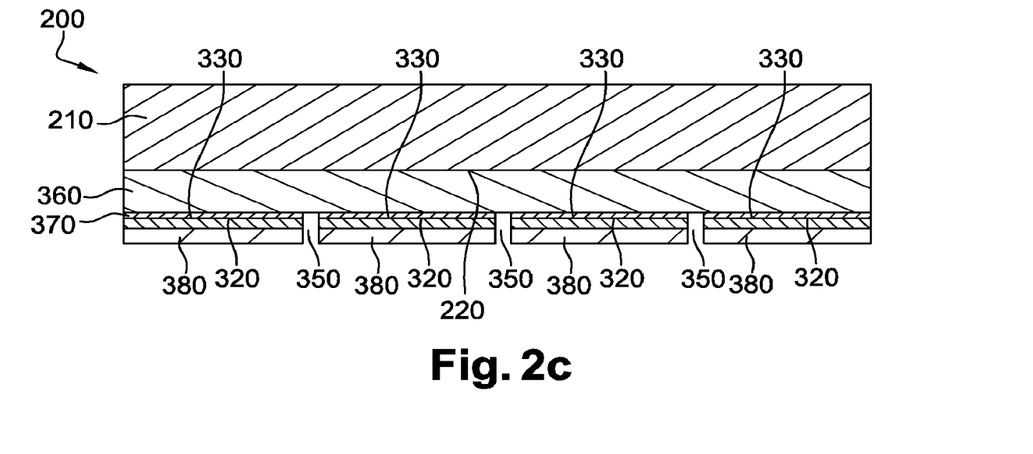
Figure 2D:
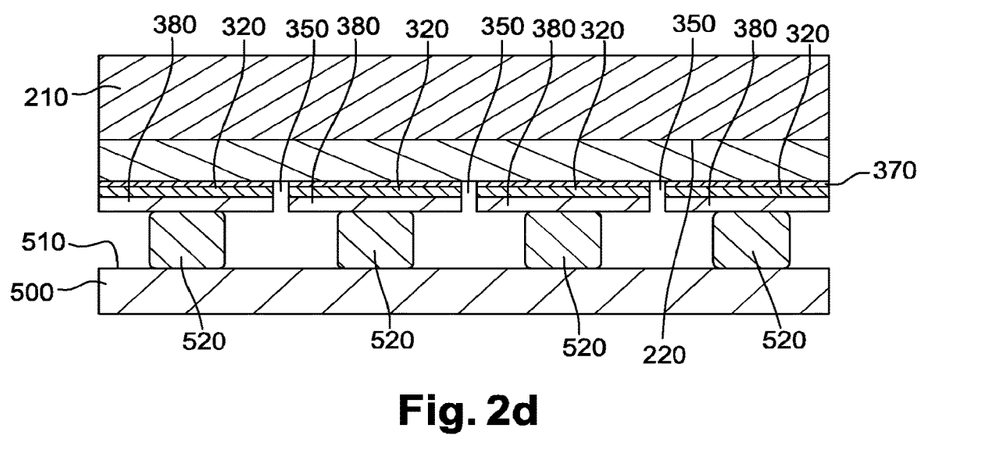
Figure 2E:
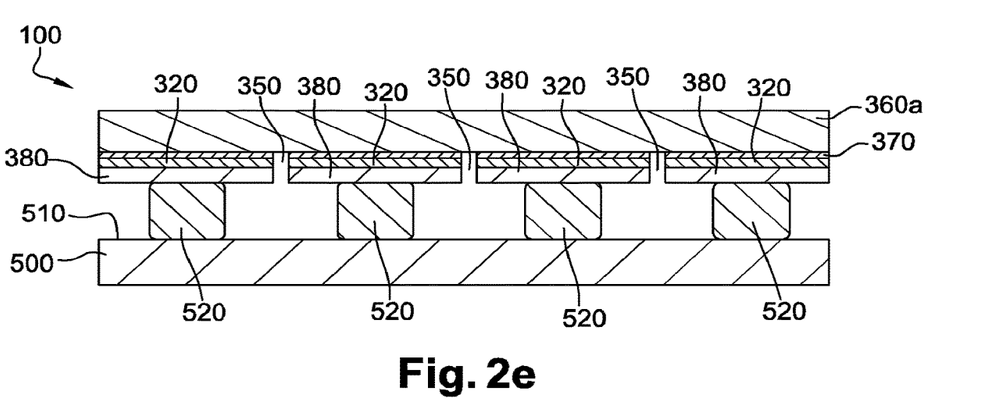
Figure 3:
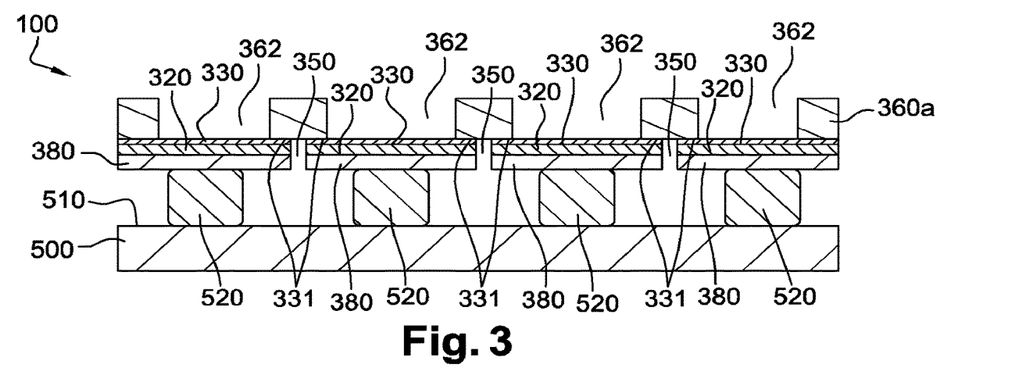
FIG. 3 is a diagrammatic representation of the electroluminescent device obtained according to a variant of the first embodiment of this invention.
Figure 4:
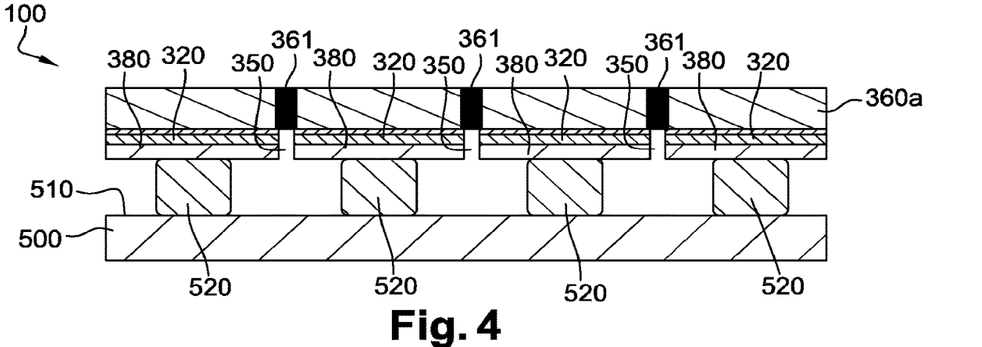
FIG. 4 is a diagrammatic representation of the electroluminescent device obtained according to a second embodiment of this invention.

The bond layer 360 comprises an electrically conducting polymer material and will form an electrode 360a common to the light emitting faces 330 (FIGS. 2e, 3 and 4).

"Electrically conducting" generally means a material for which the electrical conductivity is more than $10^3$ S/m, and preferably more than $4*10^5$ S/m.

Step a) can include formation of the bond layer 360 on either the temporary substrate 210 or a first substrate 300, that comprises the plurality of electroluminescent structures 320 separated by trenches 350 on one of its faces called the first face 310 (FIG. 2a).

It is then understood that the bond layer 360 can be formed either on the temporary face 220 or covering the light emitting faces 330 of the electroluminescent structures 320 and the trenches 350.

Step a) may also include an assembly step, called the temporary assembly step to assemble the temporary substrate 210 and the first substrate 300, the bond layer 360 thus being intercalated between the temporary substrate 210 and the first substrate 300.

Finally, step a) may include a step to remove the first substrate 300 (FIG. 2c).

The removal step may be done by thinning the first substrate 300, and particularly by grinding.

In particular, removal of the first substrate 300 may be complete or only partial, so as to leave a remainder called the support substrate 380 of said first substrate on the faces called the back faces 340 of the electroluminescent structures, and opposite the light emitting faces 330.

The thickness of the support substrate 380 can be less than 20 µm, advantageously less than 10 µm, and even more advantageously less than 5 µm.

In this case, the trenches 350 separating the electroluminescent structures 320 extend partly within the thickness of the first substrate 300, and the partial removal step is done so as to expose said trenches 350.

Thus, at the end of the step to at least partially remove the first substrate 300, the electroluminescent structures 320 are separated from each other and are only in contact with the bond layer 360 through their light emitting face 330.

According to one alternative, the electroluminescent structures 320 may comprise an active layer intercalated between a first semiconductor layer and a second semiconducting layer.

The first semiconductor layer may comprise n type GaN (n type means doped with electron donor species).

The second semiconductor layer may include p type GaN (p type means doped with hole donor species).

The active layer may comprise at least one material chosen from among: GaN, GaAs, InGaN, InGaAlP.

The active layer, the first semiconductor layer and the second semiconductor layer may be formed using epitaxial film deposition techniques on the first face 310 of the first substrate 300.

Formation of said layers makes use of techniques known to an expert in the subject and therefore will not be described in detail in this invention.

The formation of said films can also be followed by an etching step in which the trenches 350 will be formed.

According to a second alternative, the electroluminescent structure 320 may comprise nanowires or microwires perpendicular to the light emitting face 330.

"Microwire" or "nanowire" means a three-dimensional structure with an elongated shape along a preferred direction of which at least two dimensions, called the minor dimensions, are between 5 nm and 2.5 µm, preferably between 50 nm and 2.5 µm, the third dimension also called the major dimension being equal to, or preferably at least 5 times and even more preferably at least 10 times, the larger of the minor dimensions. In some embodiments, the minor dimensions may be less than or equal to about 1 µm, preferably between 100 nm and 1 µm, and more preferably between 100 nm and 300 nm. In some embodiments, the height of each microwire or nanowire may be greater than or equal to 500 nm, and preferably between 1 µm and 50 µm.

Each nanowire or microwire may non-limitatively comprise a stack composed of a zone of InGaN-n, an active zone, a zone of GaN-p or InGaN-p.

In this respect, an expert in the subject may refer to patent application [1] mentioned at the end of the description, and more particularly from page 19 line 24 to page 20 line 10.

The set of nanowires or microwires in an electroluminescent structure 320 is advantageously supported on the support substrate 380.

The plurality of electroluminescent structures 320 may for example be arranged in a matrix formation.

"Matrix formation" refers to a mesh with N rows and M columns. Each electroluminescent structure 320 is then arranged at the intersection of a row with a column of the mesh.

An intermediate layer 370 comprising a transparent conducting oxide, particularly an indium and titanium oxide, can be formed in direct contact with the light emitting face 330 of each of the electroluminescent structures 320.

The intermediate layer 370 can be formed by techniques known to an expert in the subject.

Step a) is then followed by an assembly step b) that includes bringing the back face 340 of the electroluminescent structures 320 into contact with a face called the host face 510 of a host substrate 500 (FIG. 2d).

In particular, the host face 510 may comprise interconnection means 520 arranged in combination with the common electrode 360a to individually address each of the electroluminescent structures 320.

For example, the interconnection means 520 may include a metal ball grid array. The metal balls may for example comprise indium.

Alternatively, the interconnection means 520 may include pillar structures. Pillar structures may include for example a stack of 3 µm of copper, 1 µm of nickel, 3 µm of tin and 1 µm of nickel.

During execution of the assembly step b) the interconnection means 520 are brought into contact with the back faces 340 of the electroluminescent structures 320.

Step b) may be executed by pressing the temporary structure 200 in contact with the host substrate 500.

Step b) may also imply direct bonding of the temporary structure 200 in contact with the host substrate 500.

Step b) is then followed by a step c) to at least partially remove the temporary substrate 400.

Step c) can be executed by grinding (FIGS. 2e, 3 and 4).

Thus, at the end of step c), the electroluminescent structures 320 rest on the host face 510 and they are connected through their back face 340 to the interconnection means 520.

The common electrode 360a formed by the bond layer 360 and the interconnection means 520 assure mechanical retention between the different electroluminescent structures.

In this respect, according to a first embodiment, the bond layer can be formed so as to integrally cover the light emitting faces 330 and the trenches 350.

Advantageously, the polymer material forming the bond layer can be at least partially transparent to light radiation.

"At least partially transparent to light radiation" generally means an organic polymer material for which the extinction coefficient in the range of wavelengths covered by the light radiation is less than 1%.

The polymer material may include an organic polymer material.

In particular, the polymer material may include: poly(3,4-ethylenedioxythiophene): poly(styrenesulfonate) (Pedot: PSS), Poly(fluorene)s, polyphenylenes, polypyrenes, Polyazulenes, polynaphthalenes, poly(pyrrole)s (PPY), polycarbazoles, polyindoles, polyazepines, polyanilines (PANI), poly(thiophene)s (PT), poly(p-phenylene sulfide) (PPS), Poly(acetylene)s (PAC), Poly(p-phenylene vinylene) (PPV).

Pedot: PSS, that has an electrical conductivity of the order of $4*10^5$ S/m, is particularly well adapted to form the common electrode 360a.

The polymer material may also comprise a glue containing metallic species, for example silver. In this regard, glue EPO-TEK H20E has an electrical conductivity of the order of $2.5*10^5$ S/m.

The polymer material can also comprise polymers, intrinsically non-conducting, containing nanometric conducting elements (for example with silver/Al nanowires). Reference [2] cited at the end of the description contains an example.

Figure 5:
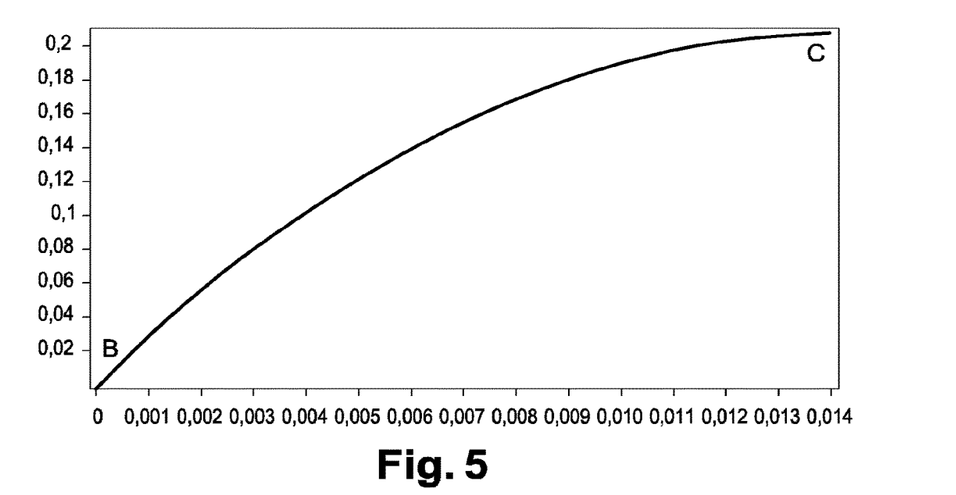
FIG. 5 is a graphic representation of the simulated mass potential (vertical axis in V) of a 10 μm thick common electrode made of Pedot: PSS, as a function of the distance (horizontal axis in m) from the edge B (null abscissa) towards the centre C (abscissa equal to 0.014 m), the simulation being made imposing a current density equal to 7500 A/$m^2$ passing through said electrode.

In this regard, the inventors have simulated the behaviour, and particularly the variation of the ground potential of a common electrode made of Pedot: PSS, with a thickness of 10 µm. To perform this simulation, the current density passing through the common electrode was equal to 7500 A/m². As shown on FIG. 5, the potential difference of 200 mV observed between the centre C and the edge B of the common electrode remains compatible with a matrix power supply for which a given current density must be imposed.

The thickness of the common electrode 360a can be more than 20 nm, advantageously more than 500 nm, even more advantageously more than 1 µm, for example more than 10 µm.

Such an arrangement of the common electrode 360a, and in particular its thickness, enables higher mechanical strength of said electrode, particularly at the trenches 350. In other words, this arrangement can prevent any mechanical failure of the common electrode at the trenches 350 that for example can occur during step b).

In the same way as in this first embodiment, through openings 362 can be formed at the common electrode 360a.

The formation of through openings 362 can occur when the bond layer 360 is formed in step a) or after step c) in which the temporary substrate 210 is removed.

The through openings 362 can be formed by dry or wet etching.

In particular, the through openings 362 are formed to partly expose the light emitting faces 330, and to keep the bond layer 360 by covering the trenches 350 and on a contour 331 of the light emitting faces 330 with a predetermined width. It is understood that the contour 131 is contiguous with the trenches 350 such that the bond layer makes a mechanical bond between two adjacent electroluminescent structures 320.

The predetermined width can be between 0.5 µm and 25 µm, advantageously between 0.5 µm and 10 µm, and even more advantageously between 0.5 and 5 µm.

As soon as the through openings 362 have been formed, it can be advantageous to consider the presence of the intermediate layer 370, particularly in the framework of an electroluminescent structure 320 composed of nanowires.

The through openings make it possible to consider organic polymer materials that are only slightly transparent or that are even opaque to light radiation.

In this regard, according to this second embodiment, the polymer material may include at least one element chosen from among: Polymer glues containing metallic conducting particles such as copper, silver or gold particles. The polymer bases may include at least one material chosen from among epoxy, acrylates, silicones, polyurethane, sol-gel matrices.

It is also possible to load a photosensitive polymer matrix (photolithographic resin) to make it conducting.

According to a second embodiment, the bond layer 360 360 may comprise second trenches 361 formed to be conforming with the trenches.

"Formed to be conforming" means second trenches 361 with essentially the same geometry. In other words, the trenches 350 and the second trenches 361 are essentially images of each other.

According to this second embodiment, the second trenches 361 can be filled in with a conducting material, the conducting material advantageously comprising a transparent conducting oxide, to obtain electrical conductivity at the common electrode 360a.

Thus according to this invention, the bond layer composed of an organic polymer material is kept at the end of the manufacturing method and forms a common electrode.

The proposed method is thus simpler than methods known in prior art.

Moreover, the mechanical strength obtained as a result of the thickness of the electrode can make the manufacturing method more reliable, and particularly the electroluminescent device formed by said method.

More particularly, the flexibility of the common electrode as a result of its nature makes it possible to accept some tolerance in terms on non-flatness of the facing faces during step b).

REFERENCES

[1] FR3012676;
[2] Jiongxin Lu et al., "*Development of Novel Silver Nanoparticles/Polymer Composites as High K Polymer Matrix by In-situ Photochemical Method*", Electronic Components and Technology Conference, 2006, Proceedings. 56th.

The invention claimed is:
1. A method of making an electroluminescent device, comprising:
   a) a first step for the formation of a temporary structure that comprises a plurality of individual electroluminescent structures separated from each other by trenches and each comprising a light emitting face, through which said structures can emit light radiation, the electroluminescent structures being bonded on their light emitting face by means of a bond layer on a temporary face of a temporary substrate;
   b) a first assembly step that includes bringing the electroluminescent structures into contact on a back face opposite the light emitting face, with a host face of a host substrate; and
   c) a step for at least partial removal of the temporary substrate;
   wherein the bond layer, that comprises an electrically conducting polymer material at least partially transparent to light radiation, is at least partly kept after step c) and the partly kept bond layer forms an electrode common to the light emitting faces, with a thickness of more than 20 nm.

2. The method according to claim 1, wherein step a) includes the formation of the bond layer on either the temporary substrate and a first substrate, the first substrate comprising a first face on which the plurality of electroluminescent structures are disposed.

3. The method according to claim 2, wherein step a) also includes a second assembly step to assemble the temporary substrate and the first substrate.

4. The method according to claim 3, wherein step a) also includes at least partial removal of the first substrate.

5. The method according to claim 2, wherein an intermediate layer comprising a transparent conducting oxide is formed in direct contact with the light emitting faces of each of the electroluminescent structures.

6. The method according to claim 1, wherein the method also includes formation of through openings in the bond layer, partially exposing the light emitting faces.

7. The method according to claim 6, wherein the formation of through openings is adapted to keep a section of the bond layer covering the trenches and a contour with a predetermined width of the light emitting faces.

8. The method according to claim 6, wherein the formation of through openings takes place either during step a) or after completion of step c).

9. The method according to claim 1, wherein the bond layer comprises second trenches formed to be conforming with the trenches, and filled in with a conducting material.

10. The method according to claim 1, wherein the polymer material comprises at least material chosen from among: Pedot PSS, poly(3,4-ethylenedioxythiophene): poly (styrenesulfonate) (Pedot: PSS), Poly(fluorene)s, polyphenylenes, polypyrenes, Polyazulenes, polynaphthalenes, poly (pyrrole)s (PPY), polycarbazoles, polyindoles, polyazepines, polyanilines (PANI), poly(thiophene)s (PT), poly(p-phenylene sulfide) (PPS), Poly(acetylene)s (PAC), Poly(p-phenylene vinylene) (PPV).

11. The method according to claim 1, wherein the electroluminescent structures comprise a light emitting layer resting on a support substrate with a thickness of less than 10 μm from a respective light emitting face towards a respective back face.

12. The method according to claim 11, wherein each of the electroluminescent structures comprises an active layer intercalated between a first semiconducting layer and a second semiconducting layer.

13. The method according to claim 11, wherein the light emitting layer comprises a plurality of nanowires perpendicular to the light emitting face.

14. The method according to claim 1, wherein the electroluminescent structures are arranged in matrix form.

15. The method according to claim 1, wherein the temporary substrate is only partially removed in step c), and comprises a material for which an optical transmission in a wavelength range covered by the light radiation is more than 1%.

16. The method according to claim 1, wherein, the host substrate comprises interconnection means on the host face that, in combination with the common electrode, is arranged to individually address each of the electroluminescent structures.

17. The method according to claim 6, comprising forming the through openings using one of a dry and a wet etching step.

18. The method according to claim 9, wherein the conducting material comprises a transparent conducting oxide.

* * * * *